United States Patent
Deshpande et al.

(10) Patent No.: US 11,342,022 B2
(45) Date of Patent: May 24, 2022

(54) LOW-POWER MULTI-STAGE/MULTI-SEGMENT CONTENT ADDRESSABLE MEMORY DEVICE

(71) Applicant: MEDIATEK Singapore Pte. Ltd., Singapore (SG)

(72) Inventors: Chetan Deshpande, San Jose, CA (US); Gajanan Sahebrao Jedhe, San Jose, CA (US); Ritesh Garg, San Jose, CA (US); Gaurang Prabhakar Narvekar, San Jose, CA (US); Yi-Wei Chen, Hsin-Chu (TW)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/088,493

(22) Filed: Nov. 3, 2020

(65) Prior Publication Data
US 2021/0174872 A1    Jun. 10, 2021

(30) Foreign Application Priority Data

Dec. 3, 2019  (IN) .............................. 201921049677
Aug. 17, 2020 (IN) .............................. 202021035397

(51) Int. Cl.
*G11C 15/04*    (2006.01)

(52) U.S. Cl.
CPC .................................... *G11C 15/04* (2013.01)

(58) Field of Classification Search
CPC ................................ G11C 15/04; G11C 5/025
See application file for complete search history.

(56) References Cited

U.S. PATENT DOCUMENTS 6,243,280 B1    6/2001  Wong et al.
6,430,074 B1 *  8/2002  Srinivasan ............. G11C 15/00
                                                        365/203

(Continued)

FOREIGN PATENT DOCUMENTS

| EP | 20208390.3     | 4/2021 |
| TW | 201935482 A    | 9/2019 |
| WO | WO 03/056564 A1 | 7/2003 |

OTHER PUBLICATIONS

Extended European Search Report dated Apr. 12, 2021 in connection with European Application No. 20208390.3.

*Primary Examiner* — Jay W. Radke
(74) *Attorney, Agent, or Firm* — Wolf, Greenfield & Sacks, P.C.

(57) ABSTRACT

Multi-stage content addressable memory devices are described. Some embodiments relate to memory devices including a plurality of rows of memory cells, multiple match lines and multiple pre-charge circuits. A first row of the plurality of rows includes a first segment and a second segment. The first segment may include a first subset of the memory cells of the first row and the second segment may include a second subset of the memory cells of the first row. The first match line is coupled to the memory cells of the first subset, and the second match line is coupled to the memory cells of the second subset. The first pre-charge circuit is configured to pre-charge the first match line to a first pre-charge voltage, and the second pre-charge circuit is configured to pre-charge the second match line to a second pre-charge voltage different from (e.g., greater than) the first pre-charge voltage.

17 Claims, 15 Drawing Sheets

(56) References Cited

U.S. PATENT DOCUMENTS

2002/0181264 A1 12/2002 Yanagawa
2015/0348628 A1 12/2015 Matsuoka et al.
2019/0164608 A1* 5/2019 Igaue .................... G11C 29/38

* cited by examiner

LOW-POWER MULTI-STAGE/MULTI-SEGMENT CONTENT ADDRESSABLE MEMORY DEVICE

CROSS REFERENCE TO RELATED APPLICATIONS

This application claims priority under 35 U.S.C. § 119 to Indian Patent Application No. 201921049677, entitled "LOW POWER MULTI-STAGE CONTENT ADDRESSABLE MEMORY DEVICE WITH SELECTABLE VOLTAGE SWINGS ON EACH STAGE" filed on Dec. 3, 2019 and Indian Patent Application No. 202021035397, entitled "LOW-POWER MULTI-STAGE/MULTI-SEGMENT CONTENT ADDRESSABLE MEMORY DEVICE" filed on Aug. 17, 2020, each of which is herein incorporated by reference in its entirety.

BACKGROUND

Content-addressable memory (CAM) is a type of computer memory that is specifically designed for search-intensive applications. Some CAMs are designed to search their entire contents in a single clock cycle. Data stored in a CAM can be accessed by searching for the data itself, and the memory retrieves the addresses where that data is located. Because of its parallel nature, CAMs are much faster than random access memory (RAM) architectures for searching. CAMs are often used in internet routers and switches, where they increase the speed of route look-up, packet classification and packet forwarding.

BRIEF SUMMARY

Some embodiments relate to a memory device comprising a plurality of rows of memory cells, wherein a first row of the plurality of rows comprises a first segment and a second segment, the first segment comprises a first subset of the memory cells of the first row and the second segment comprises a second subset of the memory cells of the first row; a first match line coupled to the memory cells of the first subset and a second match line coupled to the memory cells of the second subset; and a first pre-charge circuit configured to pre-charge the first match line to a first pre-charge voltage and a second pre-charge circuit configured to pre-charge the second match line to a second pre-charge voltage different from the first pre-charge voltage.

Some embodiments relate to a memory device comprising a plurality of rows of memory cells, wherein a first row of the plurality of rows comprises a first segment and a second segment, the first segment comprises a first subset of the memory cells of the first row and the second segment comprises a second subset of the memory cells of the first row, wherein the memory cells of the first subset are configured to store a first portion of a numeric sequence and the memory cells of the second subset are configured to store a second portion of the numeric sequence; a first input circuit configured to provide a first portion of an input numeric sequence to the first segment of the first row; a second input circuit configured to provide a second portion of the input numeric sequence to the second segment of the first row; and a first supply circuit configured to supply the first input circuit with a first supply voltage and a second supply circuit configured to supply the second input circuit with a second supply voltage different from the first supply voltage.

Some embodiments relate to a method for controlling a memory device comprising a plurality of rows of memory cells, wherein a first row of the plurality of rows comprises a first segment and a second segment, the first segment comprises a first subset of the memory cells of the first row and the second segment comprises a second subset of the memory cells of the first row, the method comprising: pre-charging a first match line to a first pre-charge voltage, the first match line being coupled to the memory cells of the first subset; pre-charging a second match line to a second pre-charge voltage different from the first pre-charge voltage, the second match line being coupled to the memory cells of the second subset; with a first input circuit, providing a first portion of an input numeric sequence to a first segment of the first row; and with a second input circuit, providing a second portion of the input numeric sequence to a second segment of the first row.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Figure 1A:
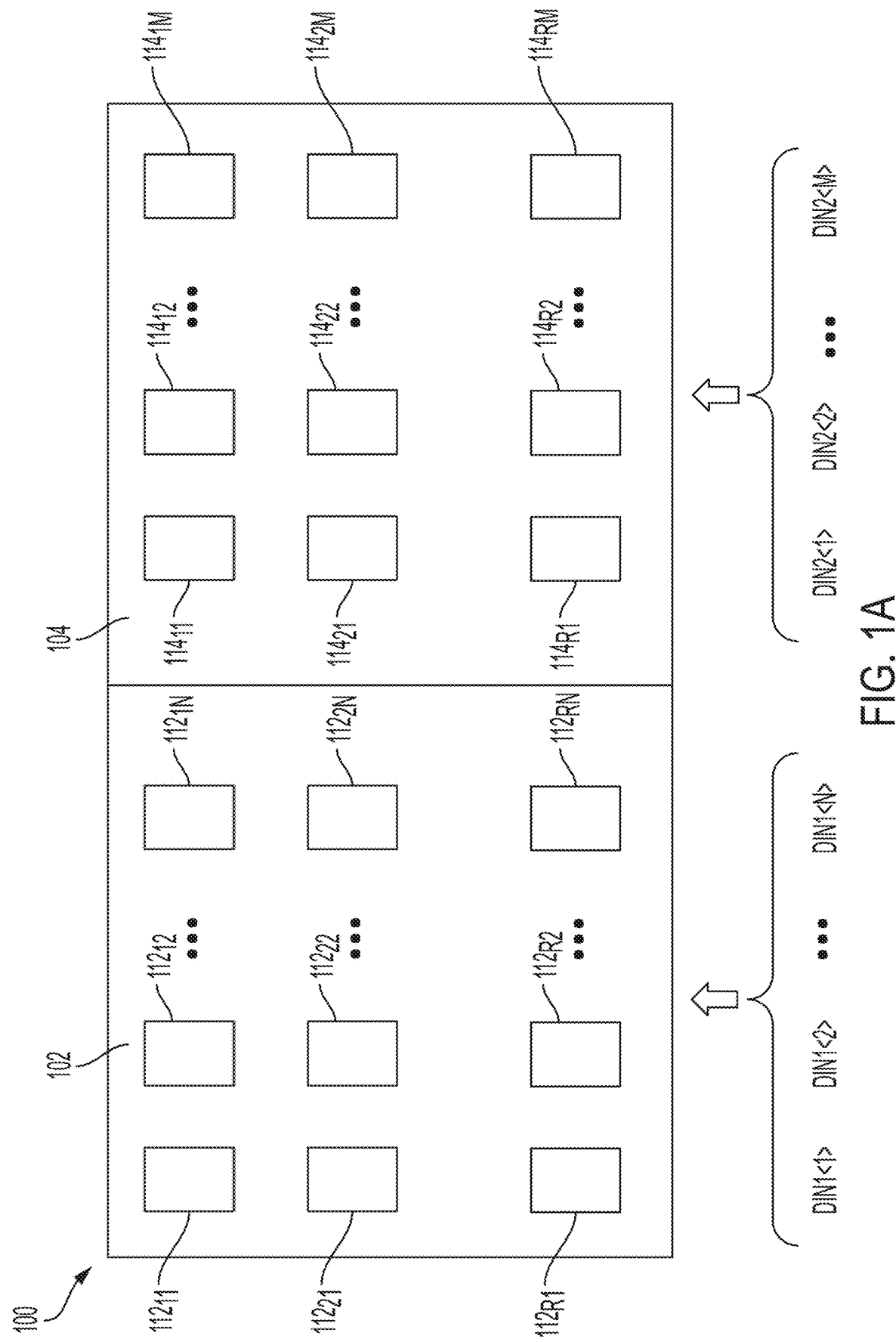
FIG. 1A is a block diagram illustrating a memory device partitioned in multiple stages, in accordance with some embodiments.

The inventors have recognized and appreciated that the high degree of parallelism with which CAMs are designed and operated, while delivering high performance, also results in significant peak current and high average power consumption. This limits the applicability of these types of memories. CAMs generally dissipate more power and have higher peak currents compared to other memory architectures such as RAMs primarily because CAMs include additional circuitry for performing comparison operations in a highly parallelized fashion.

The inventors have recognized and appreciated that the peak current and power consumption of CAMs can be partially decreased by partitioning the memory architecture in stages. In such architectures, instead of comparing input data (the data to be searched in the memory) in its entirety to the rows of the memory, the comparison is performed on a segment-by-segment basis. Consider, for example, a 64-bit CAM having 512 rows, in which the memory is searched to identify the presence (and location) of an input numeric sequence of 64 bits. In a single clock cycle, a conventional architecture compares, for each row, each bit of the input numeric sequence to a corresponding memory cell of the row. Thus, 32768 (that, 64 times 512) comparisons are performed in a single clock cycle. The number of comparisons performed in a clock cycle is generally independent of whether matches are found or not. Because it is not known a priori whether the input numeric sequence is present in the memory, the memory searches the entirety of the memory (or, in some circumstances, searches the memory until a match is found).

To the contrary, a partitioned architecture is designed to compare segments of the input numeric sequence to segments of a row. First, a first segment of the input numeric sequence is compared to a first segment of a row. If this comparison produces a match, the memory compares a second segment of the input numeric sequence to a second segment of the row. Further, if the second comparison produces a match, the memory compares a third segment of the input numeric sequence to a third segment of the row. However, if a comparison does not produce a match, the memory skips the comparison for the following segment, thereby saving power that would otherwise have been wasted in vain had the subsequent comparison been performed. In some embodiments, segment-wise comparisons are performed serially in the same clock cycle, while in other embodiments, the comparisons are pipelined in different clock cycles (this is referred to as a "multi-stage comparison").

Although these techniques reduce power consumption, the inventors have appreciated that such a reduction may be insufficient in some instances. Accordingly, the inventors have developed techniques to further reduce power consumption, thereby enabling use of CAMs in a wider range of applications. Additionally, such techniques may reduce peak currents. One such technique leverages the multi-stage architecture described above, and further involves operating the stages of the memory in different power regimes. In the first stage—when the first segment of an input numeric sequence is compared to the first segment of a row—the memory operates in a first power regime. In the second stage—when the second segment of the input numeric sequence is compared to the second segment of a row—the memory operates in a second power regime. These power regimes differ from one another in that the power required to perform a bit comparison is different. In essence, the memory can be controlled to dissipate more or less power depending on the stage/segment. For example, in the first stage, the memory may operate in the regime where a comparison is performed using the lowest power consumption. Each stage can be compared in either the same clock cycle sequentially or in stages (in a pipelined fashion).

In some embodiments, a multi-stage architecture can be arranged so that comparison of the first stage occurs more frequently than comparison of the following stages because comparison of the following stages is conditional upon finding a match in the first stage. The inventors have recognized that power can be significantly reduced by reducing the power dissipated in the first stage, or more generally, in the stage that is compared most frequently. In one example, the power consumption of a stage can be reduced by decreasing the amplitude of the voltage that supplies that stage. In another example, the power consumption of a stage can be reduced by decreasing the amplitude of the voltage that pre-charges a match line.

The inventors have further recognized, however, that reducing the voltage amplitude (and/or power consumption) associated with a stage leads to some drawbacks. One such drawback is an increase in the time required to perform a comparison operation, which in turn can reduce the speed at which the memory is searched. In some embodiments, this drawback can be obviated by operating the low-power stage at low speed while operating at least some of the other stages at higher speed. For example, low-speed clock may be used to time the operations of the low-power stage and a high-speed clock may be used to time the operations of at least some of the subsequent stages that are used less frequently. In some embodiments, this drawback can be obviated by allotting a higher percentage of the total comparison time to the low-amplitude voltage state while allotting a smaller percentage of the total comparison time to the higher amplitude voltage stage. Alternatively, fewer bit comparisons can be performed on the lower voltage amplitude comparison stage while more number of bit comparisons can be performed on a stage with higher voltage amplitude to avoid taking a performance hit.

Accordingly, some embodiments relate to a memory device (e.g., a CAM) including a plurality of rows of memory cells, multiple match lines and multiple pre-charge circuits. A first row of the plurality of rows includes, for example, a first segment and a second segment. The first segment may include a first subset of the memory cells of the first row and the second segment may include a second subset of the memory cells of the first row. The first match line is coupled to the memory cells of the first subset, and the second match line is coupled to the memory cells of the second subset. The first pre-charge circuit is configured to pre-charge the first match line to a first pre-charge voltage, and the second pre-charge circuit is configured to pre-charge the second match line to a second pre-charge voltage different from (e.g., greater than) the first pre-charge voltage. In this way, comparison of the first segment requires a different amount of (e.g., less) power than comparison of the second segment. In some embodiments, comparisons over certain stages are performed only if comparisons over the preceding stages produce a match.

In some embodiments, a first input circuit may configured to provide a first portion of an input numeric sequence to the first segment of a row of the memory device, and a second input circuit may be configured to provide a second portion of the input numeric sequence to the second segment of the row. In some such embodiments, a first clock circuit may be configured to clock the first input circuit at a first clock rate, and a second clock circuit may be configured to clock the second input circuit at a second clock rate different from (e.g., greater than) the first clock rate. In this way, comparison of the second segment can be performed at a different rate (e.g., faster) than comparison of the first segment. In some embodiments, the first segment of the row comprises a first plurality of comparators configured to compare, collectively, the first portion of the input numeric sequence to the first portion of a numeric sequence stored in memory, and the second segment of the first row comprises a second plurality of comparators configured to compare, collectively, the second portion of the input numeric sequence to the second portion of the numeric sequence stored in memory.

FIG. 1A is a block diagram illustrating a memory device partitioned into multiple stages, in accordance with some embodiments. In this example, memory device 100, which in some embodiments may be arranged as a CAM, includes stages 102 and 104. However, in other examples, memory device 100 may include more than two stages. The first row of memory device 100 includes memory cells $112_{11}$, $112_{12}$ ... $112_{1N}$, $114_{11}$, $114_{12}$ ... $114_{1M}$ (where M and N may be equal or different). The memory cells $112_{11}$, $112_{12}$ ... $112_{1N}$ form a first segment of the row, and the memory cells $114_{11}$, $114_{12}$ ... $114_{1M}$ form a second segment of the row. The other rows may also be arranged in segments. For example, the second row has a first segment including memory cells $112_{21}$, $112_{22}$ ... $112_{2N}$, and a second segment including memory cells $114_{21}$, $114_{22}$ ... $114_{2M}$. Similarly, the $R^{th}$ row has a first segment including memory cells $112_{R1}$, $112_{R2}$ ... $112_{RN}$, and a second segment including memory cells $114_{R1}$, $114_{R2}$ ... $114_{RM}$.

Considering the first row as an example, in some embodiments, comparisons over the memory cells $114_{11}$, $114_{12}$ ... $114_{1M}$ may be performed only if the comparisons over the memory cells $112_{11}$, $112_{12}$ ... $112_{1N}$ produce a match.

Memory device 100 may be arranged, among other architectures, as a binary CAM or a ternary CAM. In the binary CAM implementation, only two states can be represented, 0 and 1. In the ternary CAM implementation, the memory may be able to store and query data using three different inputs: 0, 1 and X. The "X" input is referred to as "wildcard" state. For example, a ternary CAM might have a stored numeric sequence of "10XX0" which would be matched by any of the four input numeric sequences "10000," "10010," "10100," and "10110".

Figure 1B:
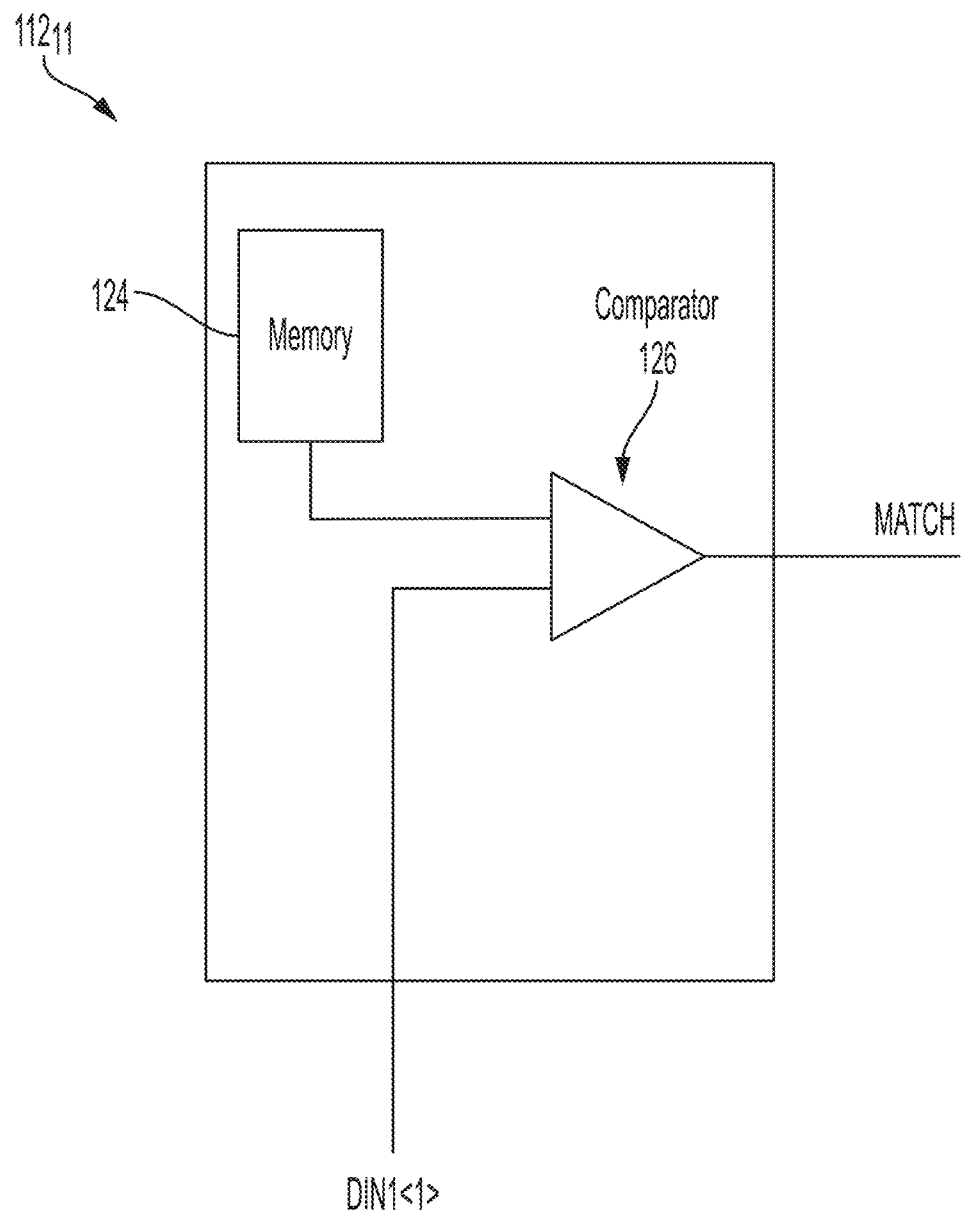
FIG. 1B is a block diagram illustrating a memory cell of the memory device of FIG. 1A in additional detail, in accordance with some embodiments.

FIG. 1B illustrates a representative memory cell in additional detail. In this example, memory cell $112_{11}$ includes a memory 124 and a comparator 126. Memory 124 may be configured to store 1 numeric values (binary, ternary or x-ary). For example, memory 124 may include a static RAM, a dynamic RAM, or other types of memories. Comparator 126 may be designed to compare an input numeric value with the numeric value stored in memory 124. The output of the comparator may be 1 if the inputs match, or 0 if the inputs do not match (though the opposite logic is also possible). In some embodiments, in the ternary CAM implementation, each memory cell may further include an additional memory to store a mask—a value indicative of whether the value stored in the memory cell is to be treated as a wildcard.

The memory device of FIG. 1A may be designed to perform a search operation to identify the presence and the location of a particular input numerical sequence. A representative numerical sequence is shown at the bottom of FIG. 1A, where DIN1<1>, DIN1<2> ... DIN1<N> represent the bits of a first segment of the input numerical sequence and DIN2<1>, DIN2<2> ... DIN2<M> represent the bits of a second segment of the input numerical sequence. During the first step of the search operation, the first segment of the input numerical sequence is compared to the first segments of the rows of the memory device. If there is no match, the search operation ends, thus saving power that would otherwise be wasted in vain had the second segments been compared. However, if there is a match, the second segment of the input numerical sequence is compared to the second segment of the rows. If a complete match is identified, the memory device returns the address of the matching row or a match flag indicating a particular row matched.

Figure 2A:
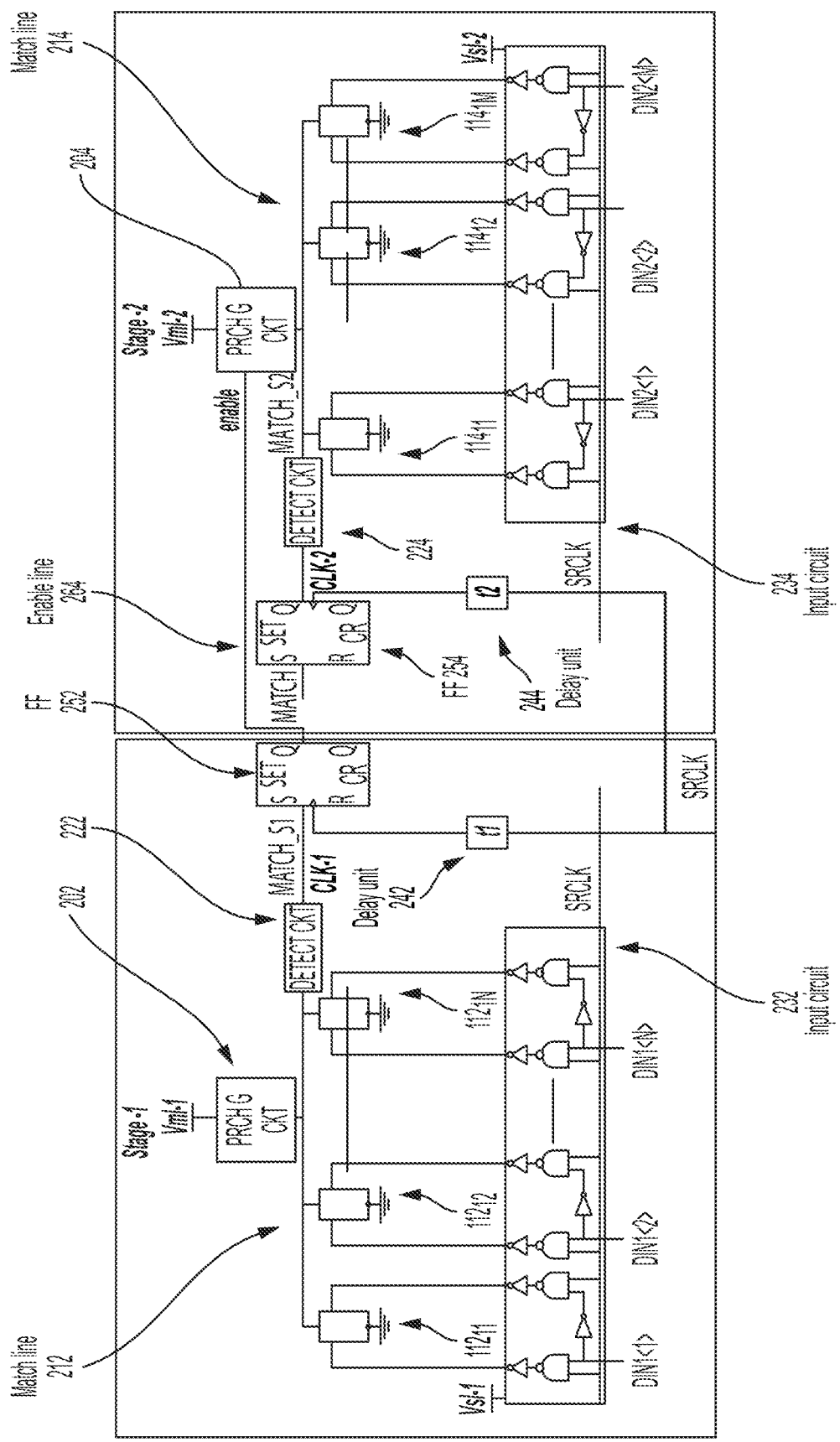
FIG. 2A is a block diagram illustrating one row of the memory device of FIG. 1A, in accordance with some embodiments.

In some embodiments, the comparisons over the first stage are performed in a lower voltage/power, and optionally low-speed, regime. By contrast, the comparisons over the second stage are performed using higher voltage (thus consuming more power) and optionally a faster clock, thereby improving accuracy and/or speed. FIG. 2A illustrates a portion of a memory device arranged in this manner. In particular, FIG. 2A illustrates one row of the memory device, though other rows may be arranged similarly. As will be appreciated further below, input circuits 232 and 234 may be shared among several rows. In this example, the memory device is partitioned in two stages. The first stage includes memory cells $112_{11}$, $112_{12}$ ... $112_{1N}$, input circuit 232, match line 212, pre-charge circuit 202, delay unit 242, detector 222, and flip-flop 252. The second stage includes memory cells $114_{11}$, $114_{12}$ ... $114_{1M}$, input circuit 234, match line 214, pre-charge circuit 204, enable line 264, detector 224, delay unit 244 and flip-flop 254.

Input circuit 232 receives a first portion of an input numerical sequence and provides it to the first segments of the rows of the memory device, so that comparison operations may be performed. In this example, the input circuit is implemented using NAND gates and NOT gates, though other implementations are also possible. In this implementation, the input circuit provides the first portion of the input numerical sequence to the first segment of the row with timing determined by clock SRCLK. The outputs of the memory cells are coupled to match line 212. For example, the outputs of the various comparators 126 (FIG. 1B) may be coupled to match line 212.

Initially, before performance of search operation at the first stage, match line 212 is pre-charged at a certain pre-charge voltage (Vml-1). The value of the pre-charged voltage is set by pre-charge circuit 202. If all the outputs of the memory cells produce a 1 (indicating a match), the voltage at the match line remains constant and equal to the pre-charge voltage. However, if comparison with one of the memory cells does not produce a match, that memory cell forms a path between match line 212 and ground, thereby reducing the voltage at the match line.

Detector 222 determines whether the first segment of the input numerical sequence matches the first segment of the row. For example, in some embodiments, detector 222 compares the voltage at the match line with a threshold voltage, and determines whether there is a match depending on the result of the comparison.

If detector 222 determines that there is a match, the line "MATCH_S1" is asserted, thereby asserting, via flip-flop 252, enable line 264. An asserted enable line indicates that a comparison over the second stage can proceed. As a result, the values provided by input circuit 234 are compared to the second segment of memory cells of the row. As described above in connection with the first stage, pre-charge circuit 204 pre-charges match line 214 at a certain pre-charge voltage (Vml-2). If all the outputs of the memory cells produce a 1, the voltage at the match line 214 ("MATCH S2") remains constant. However, if there is at least one mismatch, the voltage is reduced. Detector 224 determines whether the second segment of the input numerical sequence matches the second segment of the memory cells of the row based on the voltage at match line 214 (for example, by comparing the voltage at the match line to a threshold voltage). If detector 224 determines that there is a match, the line "MATCH" is asserted using flip flop 254.

Figure 2B:
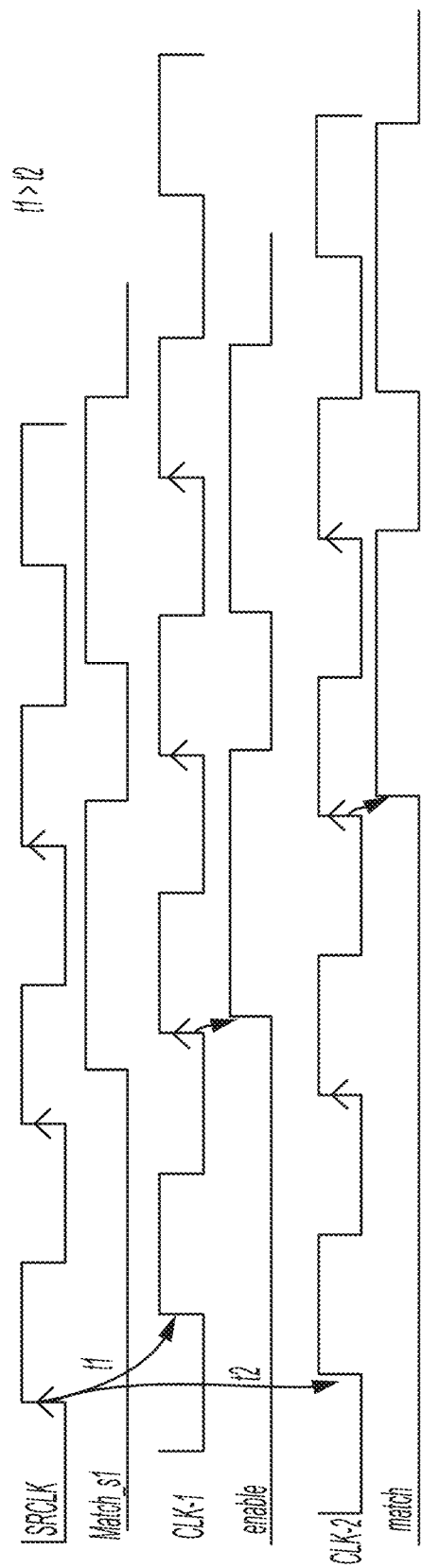
FIG. 2B is a signal diagram illustrating timing of some of the control signals depicted in FIG. 2A, in accordance with some embodiments.

The clock used for timing the operations of the memory device is SRCLK. As shown in FIG. 2A, clock SRCLK controls the timing of the input circuits 232 and 234 and flip-flops 252 and 254. However, clock SRCLK is delayed by t1 before reaching flip-flop 252 and is delayed by t2 before reaching flip-flop 254. In some embodiments, pre-charge circuits 202 and 204 can be programmed to allow for time-borrowing between stages. For example, the time at which the comparison in one stage is performed may be delayed with respect to the time at which comparison in another stage is performed. The amount of delay may be set depending on one or more factors, including for example the relative magnitudes of Vml-1 and Vml-2, and/or the number of comparisons to be performed in each stage. Delay units t1 and t2 may be used to set the delays. FIG. 2B is a signal diagram illustrating the timing of the comparisons, in accordance with some embodiments. Clock CLK-1, which controls the timing of flip-flop 252, is delayed by t1 relative to clock SRCLK. Clock CLK-2, which controls the timing of flip-flop 254, is delayed by t2 relative to clock SRCLK. The result is that the line ENABLE is asserted before the line MATCH is asserted. In some embodiments, the clock (e.g., CLK-1) of the stage operating at a lower voltage is delayed less than the clock (e.g., CLK-2) of the stage operating at higher voltage. In this way, the circuit is operated at a higher speed.

In some embodiments, the power required to operate the first stage may be reduced by reducing the voltage with which match line 212 is pre-charged relative to the voltage with which match line 214 is pre-charged. For example, match line 212 may be pre-charged with a voltage Vml-1 that is less than pre-charge voltage Vml-2. Examples of pre-charge circuits for controlling the magnitude of the pre-charge voltages are described in detail in connection with FIGS. 3A, 4A and 5A.

Figure 3A:
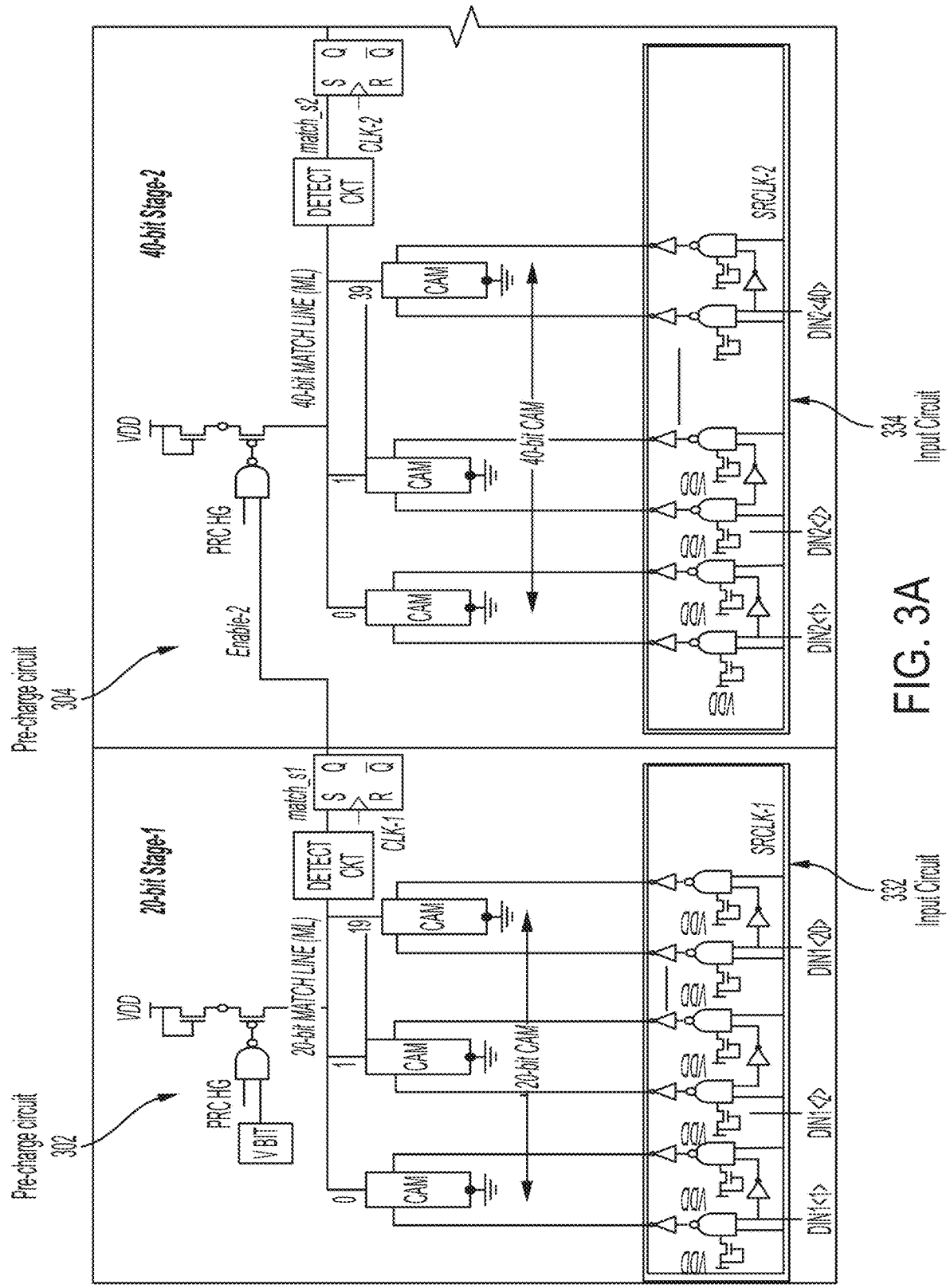
FIG. 3A is a block diagram illustrating a first example of a row that may be part of the memory device of FIG. 1A, in accordance with some embodiments.
Figure 3A:
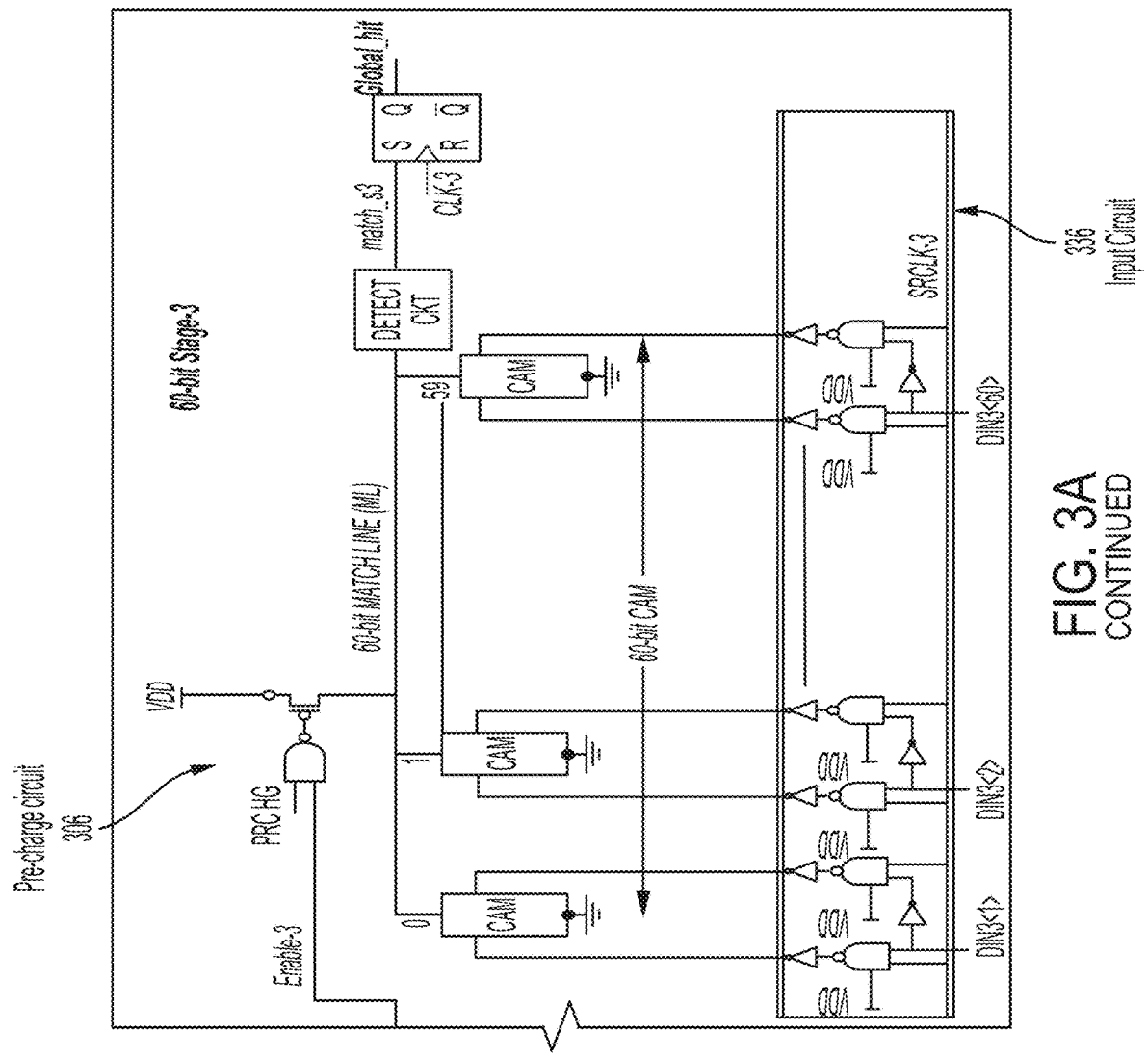

The example of FIG. 3A illustrates a memory device having three stages, the first stage having 20 columns, the second stage having 40 columns and the third stage having 60 columns. Of course, not all embodiments are limited to this specific implementation. The first stage includes pre-charge circuit 302, the second stage includes pre-charge circuit 304 and the third stage includes pre-charge circuit 306. Each pre-charge circuit is configured to pre-charge the respective match line.

In some embodiments, pre-charge circuit 302 pre-charges the respective match line at a voltage less that the voltage with which either or both of the subsequent match lines are pre-charged, thereby reducing the power requirements of the first stage, the stage that is operated most frequently.

Figure 3B:
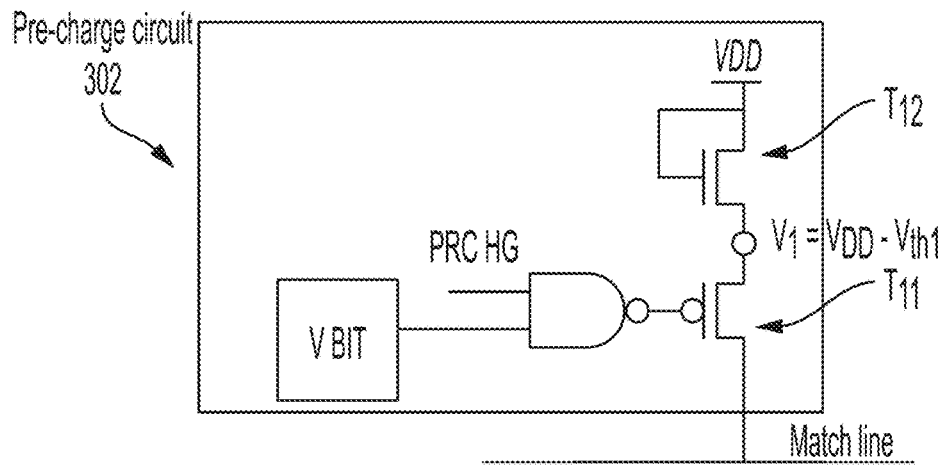
FIG. 3B is a block diagram illustrating the pre-charge circuit of the first stage of the row of FIG. 3A, in accordance with some embodiments.
Figure 3C:
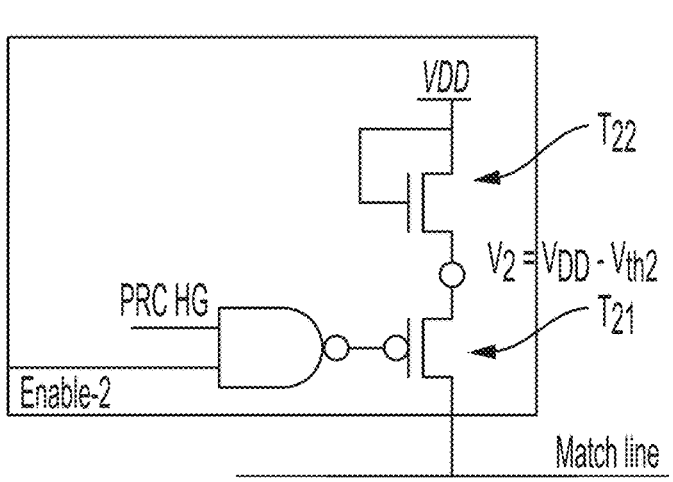
FIG. 3C is a block diagram illustrating the pre-charge circuit of the second stage of the row of FIG. 3A, in accordance with some embodiments.
Figure 3D:
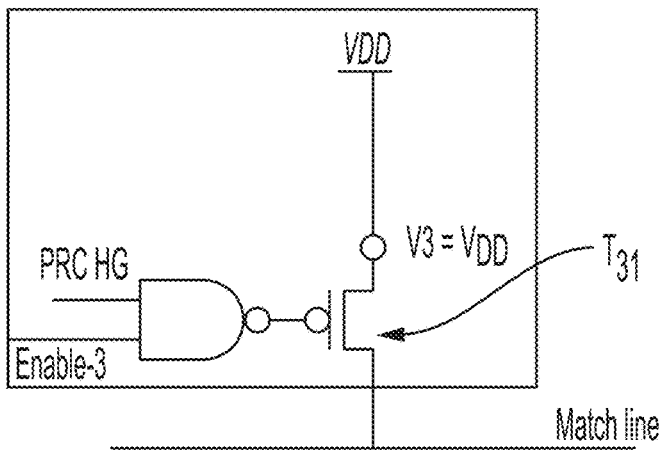
FIG. 3D is a block diagram illustrating the pre-charge circuit of the third stage of the row of FIG. 3A, in accordance with some embodiments.

FIGS. 3B, 3C and 3D illustrate pre-charge circuits 302, 304 and 306, respectively, in additional detail. As shown in FIG. 3B, pre-charge circuit 302 is enabled by control signals VBIT and PRCHG. When both of these signals are asserted, transistor $T_{11}$ is turned on. The voltage at transistor $T_{11}$ ($V_1$) is determined by the threshold voltage of transistor $T_{12}$ ($V_{th1}$). In particular, $V_1=V_{DD}-V_{th1}$. When transistor $T_{11}$ is in the on-state, the match line is pre-charged to $V_1$ (or a fraction thereof).

Pre-charge circuit 304 operates in a similar manner. When a match is found between the first segment of the input numerical sequence and the first segment of the row, line enable-2 is asserted. This assertion, in turn, enables transistor $T_{21}$, as shown in FIG. 3C, thereby enabling pre-charge circuit 304. The voltage at transistor $T_{21}$ ($V_2$) is determined by the threshold voltage of transistor $T_{22}$ ($V_{th2}$). In particular, $V_2=V_{DD}-V_{th2}$. When transistor $T_{21}$ is in the on-state, the match line is pre-charged to $V_2$ (or a fraction thereof).

In these example, transistors $T_{12}$ and $T_{22}$ are implemented as NMOS transistors. However, other types of transistors are also possible, as described for example in connection with FIGS. 4B and 4C.

Lastly, when a match is found between the second segment of the input numerical sequence and the second segment of the row, line enable-3 is asserted. This assertion, in turn, enables transistor $T_{31}$, as shown in FIG. 3D, thereby enabling pre-charge circuit 306. The voltage at transistor $T_{31}$ ($V_3$) is equal to $V_{DD}$. When transistor $T_{31}$ is in the on-state, the match line is pre-charged to $V_3$ (or a fraction thereof).

In some embodiments, the pre-charge voltages $V_1$, $V_2$ and $V_3$, may be different from one another, thus permitting control of the power required to operate each stage of the memory device. For example in some embodiments, the threshold voltage of transistor $T_{12}$ is greater than the threshold voltage of transistor $T_{22}$. As a result, the power required to operate the first stage is less than the power required to operate the second stage.

Figure 3E:
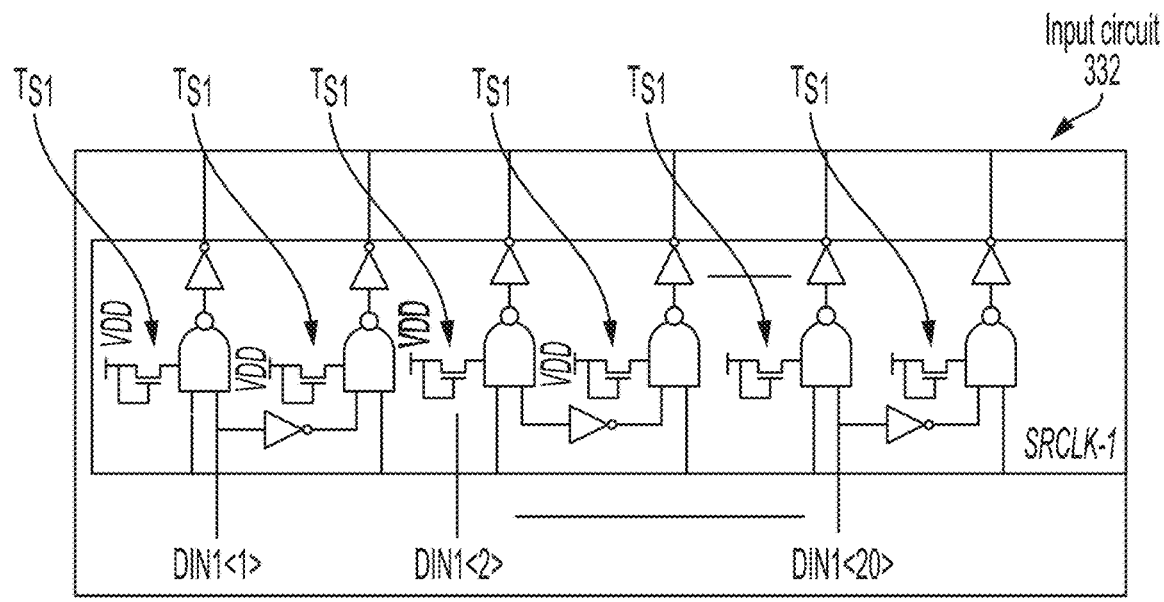
FIG. 3E is a block diagram illustrating the input circuit of the first stage of the row of FIG. 3A, in accordance with some embodiments.
Figure 3F:
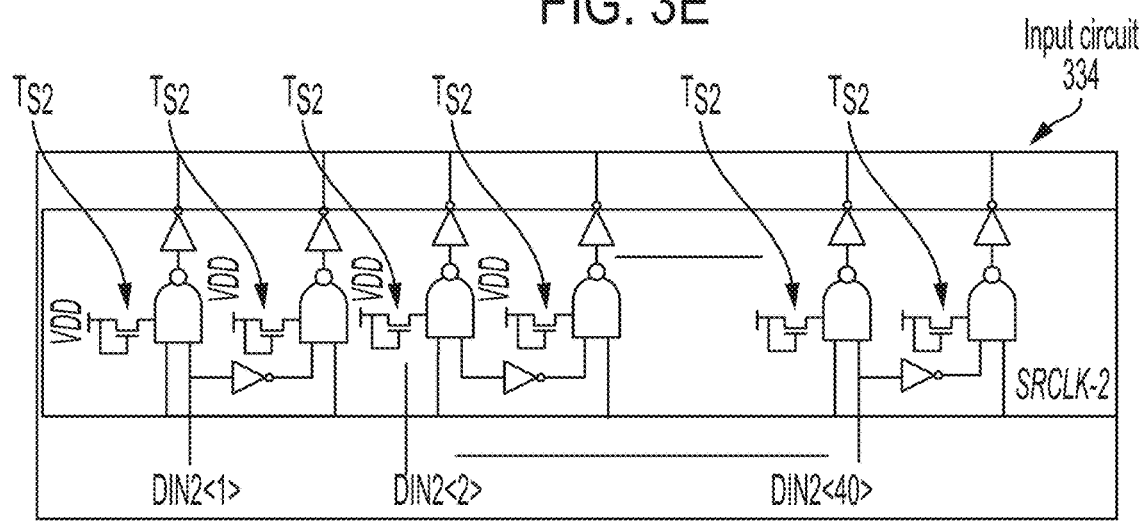
FIG. 3F is a block diagram illustrating the input circuit of the second stage of the row of FIG. 3A, in accordance with some embodiments.
Figure 3G:
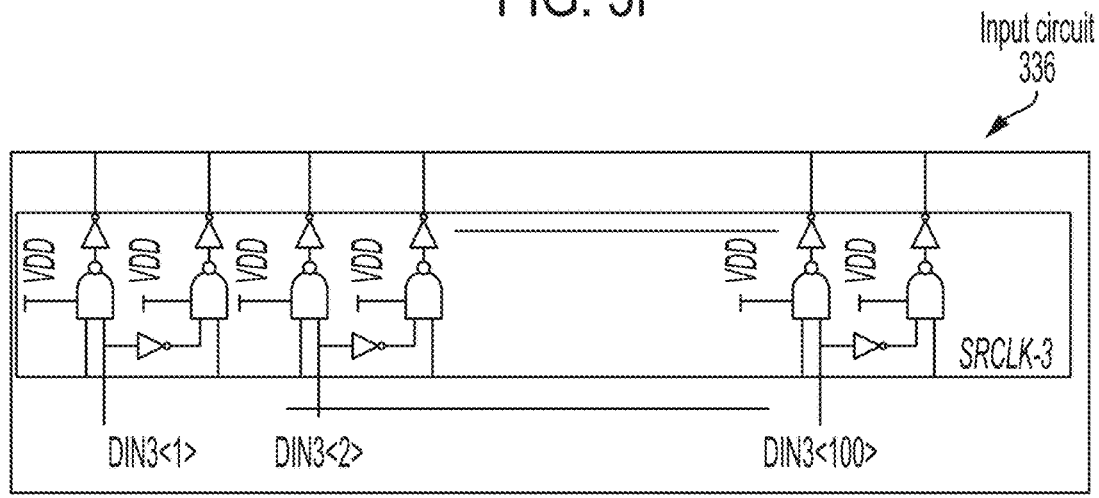
FIG. 3G is a block diagram illustrating the input circuit of the third stage of the row of FIG. 3A, in accordance with some embodiments.

In addition, or in alternative, to varying the pre-charge voltage across the stages, in some embodiments, the power of a stage may be controlled by varying, across the stages, the supply voltages provided to the input circuits. FIGS. 3E, 3F and 3G illustrate input circuits 332, 334 and 336, respectively, in additional detail. As shown in FIG. 3E, the ports of input circuit 332 receive a supply voltage equal to $V_{DD}$ less than the threshold voltage of transistors $T_{S1}$. As shown in FIG. 3F, the ports of input circuit 334 receive a supply voltage equal to $V_{DD}$ less than the threshold voltage of transistors $T_{S2}$. Lastly, as shown in FIG. 3G, the ports of input circuit 336 receive a supply voltage equal to $V_{DD}$. In some embodiments, the threshold voltage of transistors $T_{S1}$ is greater than the threshold voltage of transistors $T_{S2}$, such that the supply voltages that input circuit 332 receives is less than the supply voltage that input circuit 334 receives. The result is that the input circuit 332 uses less power than input circuit 334, and input circuit 334 uses less power than input circuit 336.

In some embodiments, match lines that are operated at higher voltage are also operated at higher clock rates, thus increasing the speed with which the subsequent stages are operated. For example, referring back to FIG. 3A, clock CLK-1 may have a lower rate than clock CLK-2, and clock CLK-2 may have a lower rate than clock CLK-3. Additionally, or alternatively, input circuits that are operated at higher voltage are also operated at higher clock rates, thus increasing the speed with which the subsequent input circuits are operated. For example, referring back to FIGS. 3E-3G, clock SRCLK-1 may have a lower rate than clock SRCLK-2, and clock SRCLK-2 may have a lower rate than clock SRCLK-3.

FIG. 3A illustrates one possible implementation for the pre-charge circuits. Another possible implementations are illustrated in FIGS. 4A and 5A.

Figure 4A:
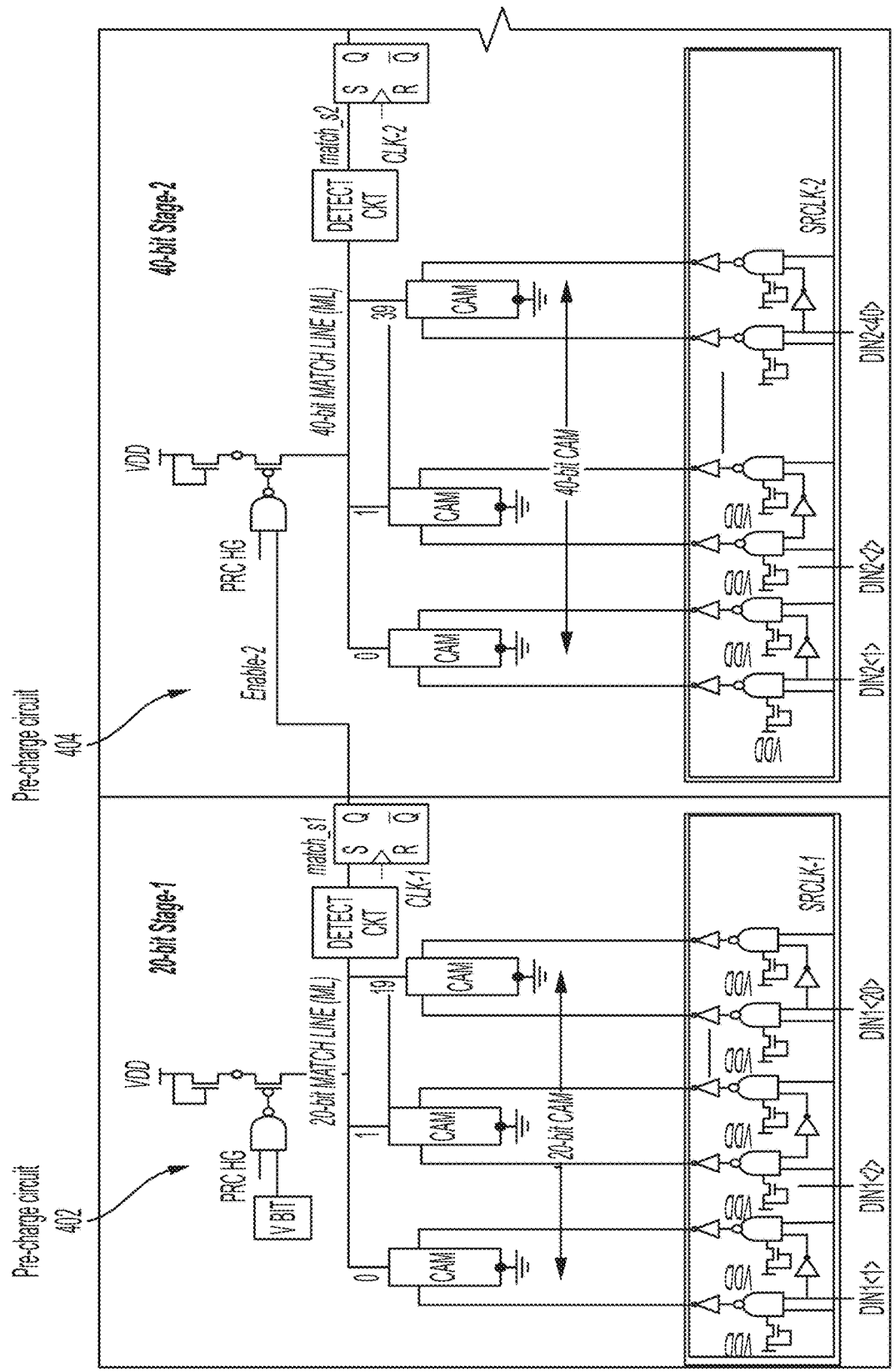
FIG. 4A is a block diagram illustrating a second example of a row that may be part of the memory device of FIG. 1A, in accordance with some embodiments.
Figure 4A:
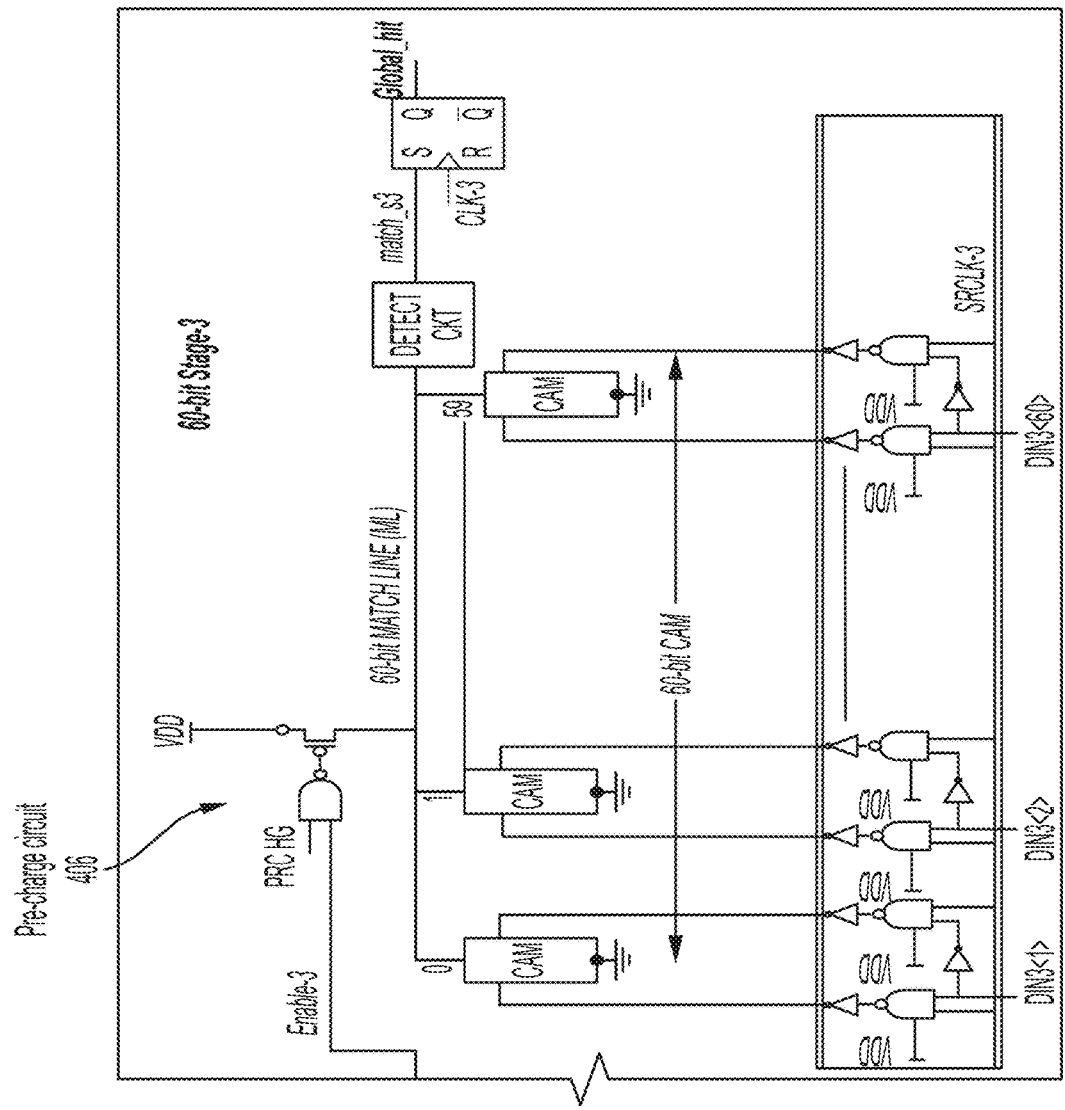
Figure 4B:
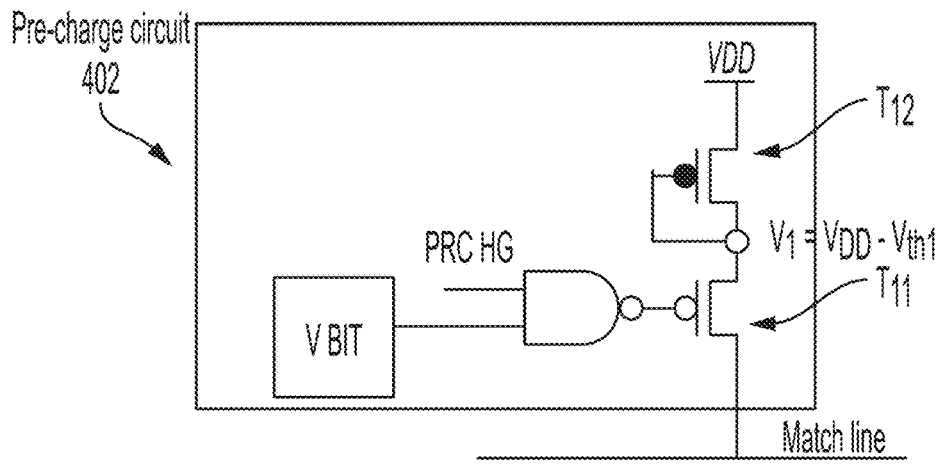
FIG. 4B is a block diagram illustrating the pre-charge circuit of the first stage of the row of FIG. 4A, in accordance with some embodiments.
Figure 4C:
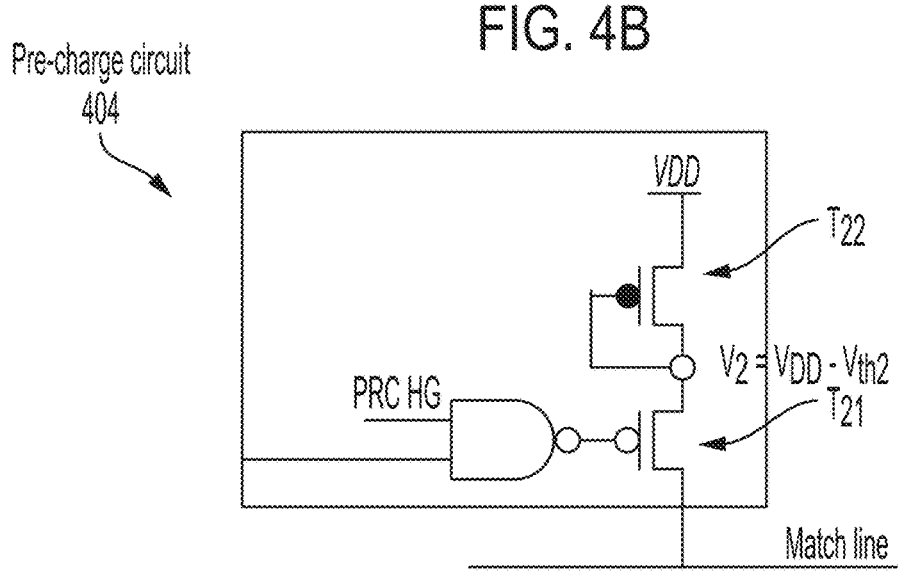
FIG. 4C is a block diagram illustrating the pre-charge circuit of the second stage of the row of FIG. 4A, in accordance with some embodiments.
Figure 4D:
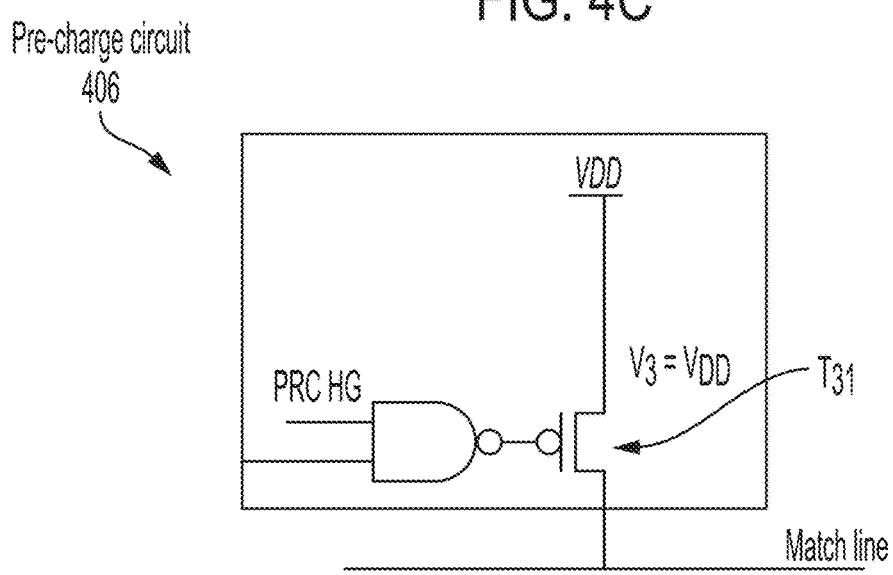
FIG. 4D is a block diagram illustrating the pre-charge circuit of the third stage of the row of FIG. 4A, in accordance with some embodiments.
Figure 5A:
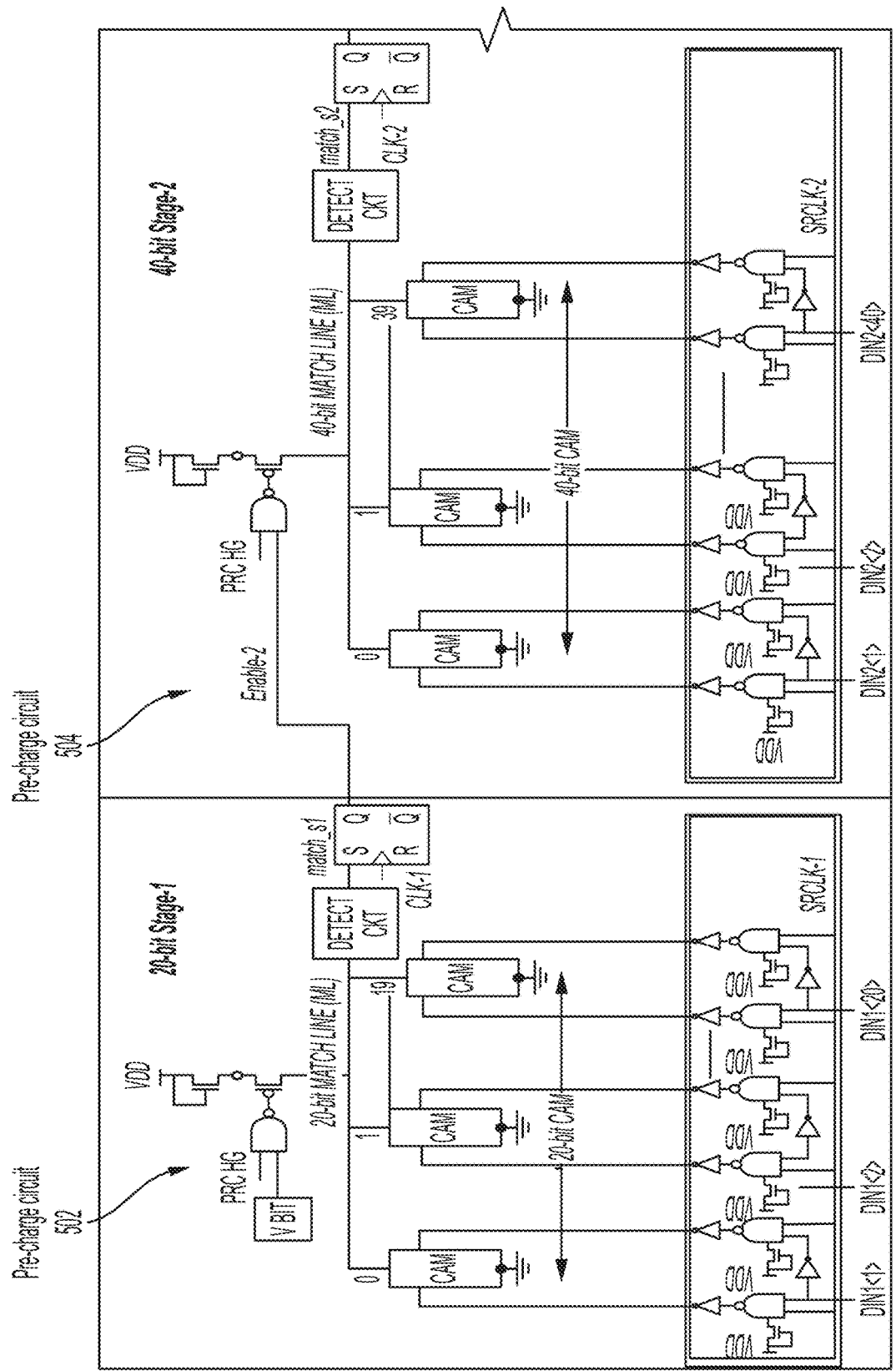
FIG. 5A is a block diagram illustrating a third example of a row that may be part of the memory device of FIG. 1A, in accordance with some embodiments.
Figure 5A:
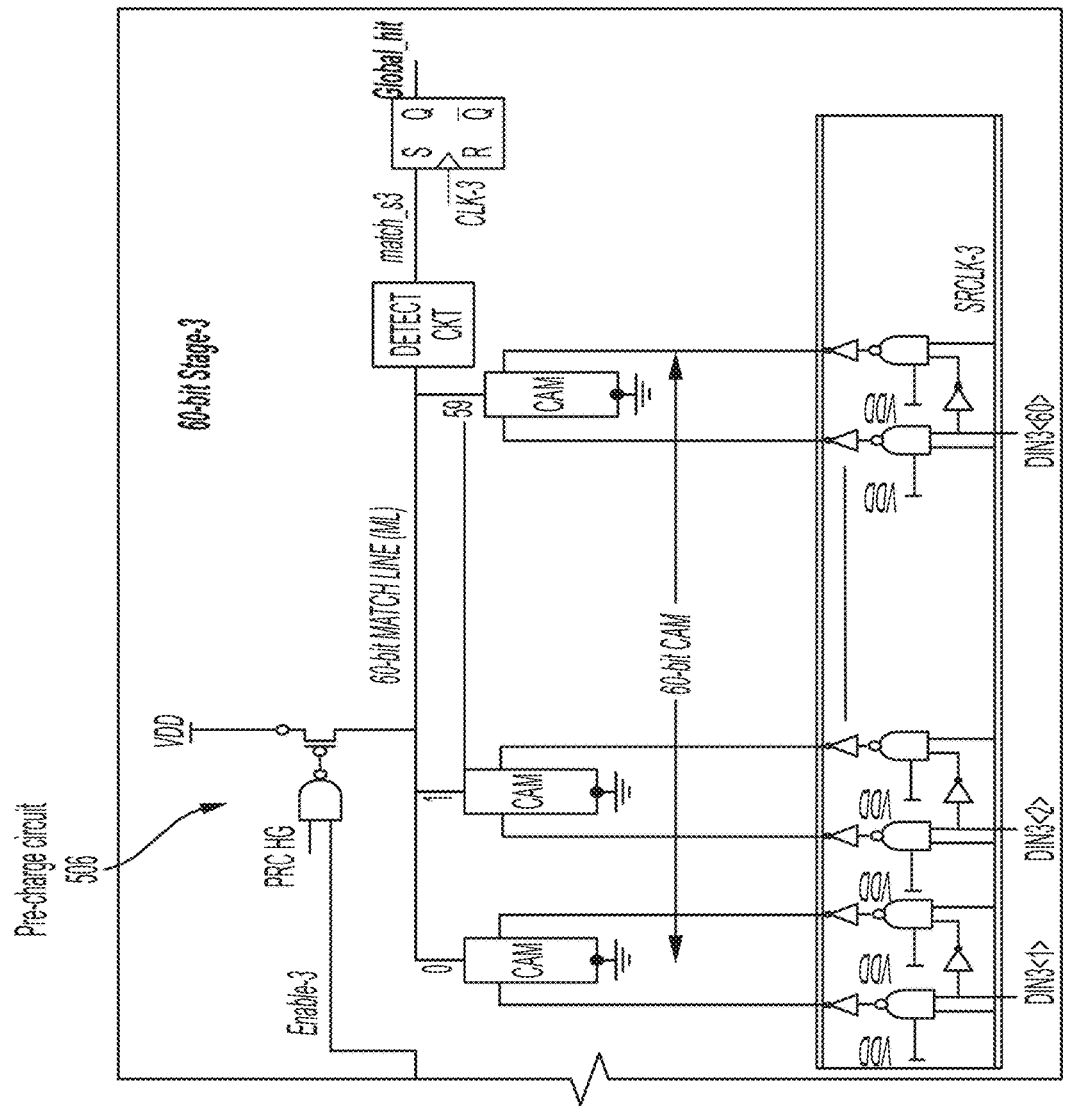

In the example of FIG. 4A, instead of using NMOS transistors for $T_{12}$ and $T_{22}$ as in FIG. 3A, PMOS transistors are used. FIGS. 4B, 4C and 4D illustrate pre-charge circuits 402, 404 and 406 of FIG. 4A, respectively, in additional detail. As shown in FIG. 4B, pre-charge circuit 402 is enabled by control signals VBIT and PRCHG. When both of these signals are asserted, transistor $T_{11}$ is turned on. The voltage at transistor $T_{11}$ ($V_1$) is determined by the threshold voltage of transistor $T_{12}$ ($V_{th1}$). In particular, $V_1 = V_{DD} - V_{th1}$. When transistor $T_{11}$ is in the on-state, the match line is pre-charged to $V_1$ (or a fraction thereof). In this example, transistor $T_{21}$ is implemented using a PMOS.

Pre-charge circuit 404 operates in a similar manner. When a match is found between the first segment of the input numerical sequence and the first segment of the row, line enable-2 is asserted. This assertion, in turn, enables transistor $T_{21}$, as shown in FIG. 4C, thereby enabling pre-charge circuit 404. The voltage at transistor $T_{21}$ ($V_2$) is determined by the threshold voltage of transistor $T_{22}$ ($V_{th2}$). In particular, $V_2 = V_{DD} - V_{th2}$. When transistor $T_{21}$ is in the on-state, the match line is pre-charged to $V_2$ (or a fraction thereof). In this example, transistor $T_{21}$ is also implemented using a PMOS.

Lastly, when a match is found between the second segment of the input numerical sequence and the second segment of the row, line enable-3 is asserted. This assertion, in turn, enables transistor $T_{31}$, as shown in FIG. 4D, thereby enabling pre-charge circuit 306. The voltage at transistor $T_{31}$ ($V_3$) is equal to $V_{DD}$. When transistor $T_{31}$ is in the on-state, the match line is pre-charged to $V_3$ (or a fraction thereof).

In some embodiments, the threshold voltage of transistor $T_{12}$ is greater than the threshold voltage of transistor $T_{22}$. As a result, the power required to operate the first stage is less than the power required to operate the second stage.

Figure 5B:
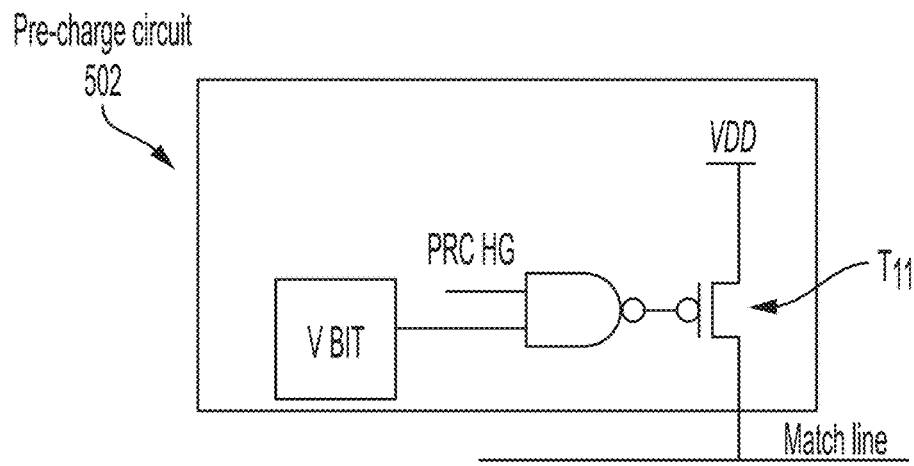
FIG. 5B is a block diagram illustrating the pre-charge circuit of the first stage of the row of FIG. 5A, in accordance with some embodiments.
Figure 5C:
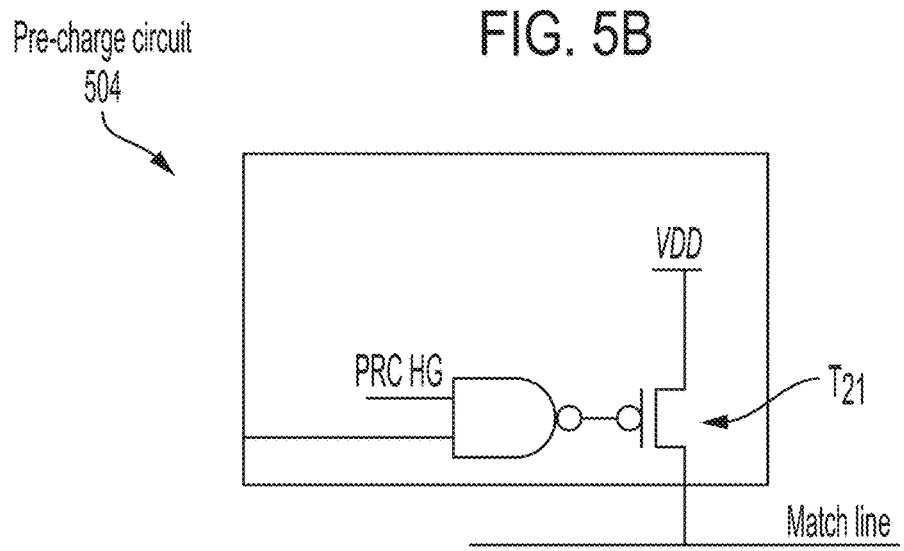
FIG. 5C is a block diagram illustrating the pre-charge circuit of the second stage of the row of FIG. 5A, in accordance with some embodiments.
Figure 5D:
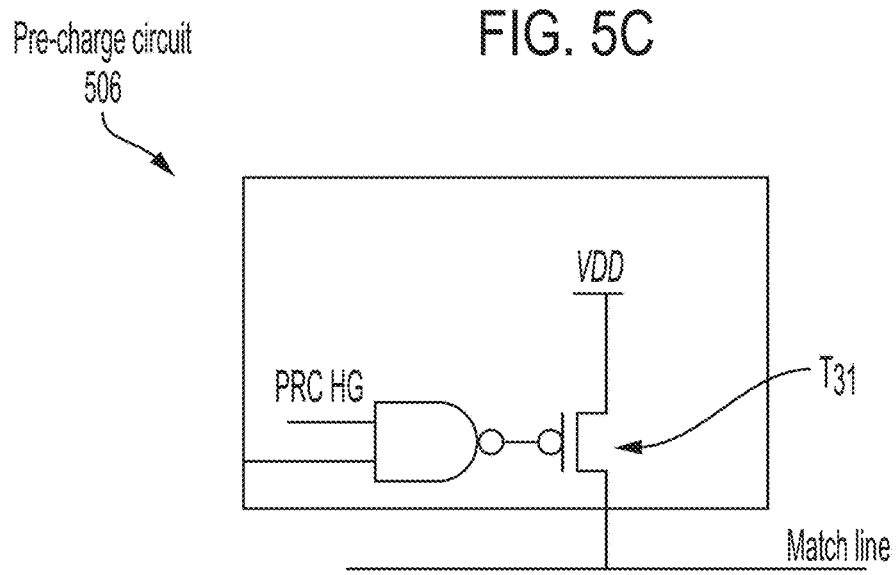
FIG. 5D is a block diagram illustrating the pre-charge circuit of the third stage of the row of FIG. 5A, in accordance with some embodiments.

In the example of FIG. 5A, a single transistor is used instead of multiple transistors to allow for charge of the match line. FIGS. 5B, 5C and 5D illustrate pre-charge circuits 502, 504 and 506 of FIG. 5A, respectively, in additional detail. In this example, transistors $T_{11}$, $T_{21}$ and $T_{31}$ are designed to be mutually different relative to one another, so that the voltage drop (and/or rate of charging of match line) across transistors $T_{11}$ is different from the voltage drop (and/or rate of charging the match line) across transistors $T_{21}$, which is different from the voltage drop (and/or rate of charging) across transistors $T_{31}$ For example, the transistors may have different dimensions and/or threshold voltages. The result is that the match lines of FIGS. 5B-5D are pre-charged to different voltage levels. In some embodiments, transistors $T_{11}$, $T_{21}$, $T_{31}$ can be made NMOS-type by inserting an inverter after the NAND gate.

Figure 6:
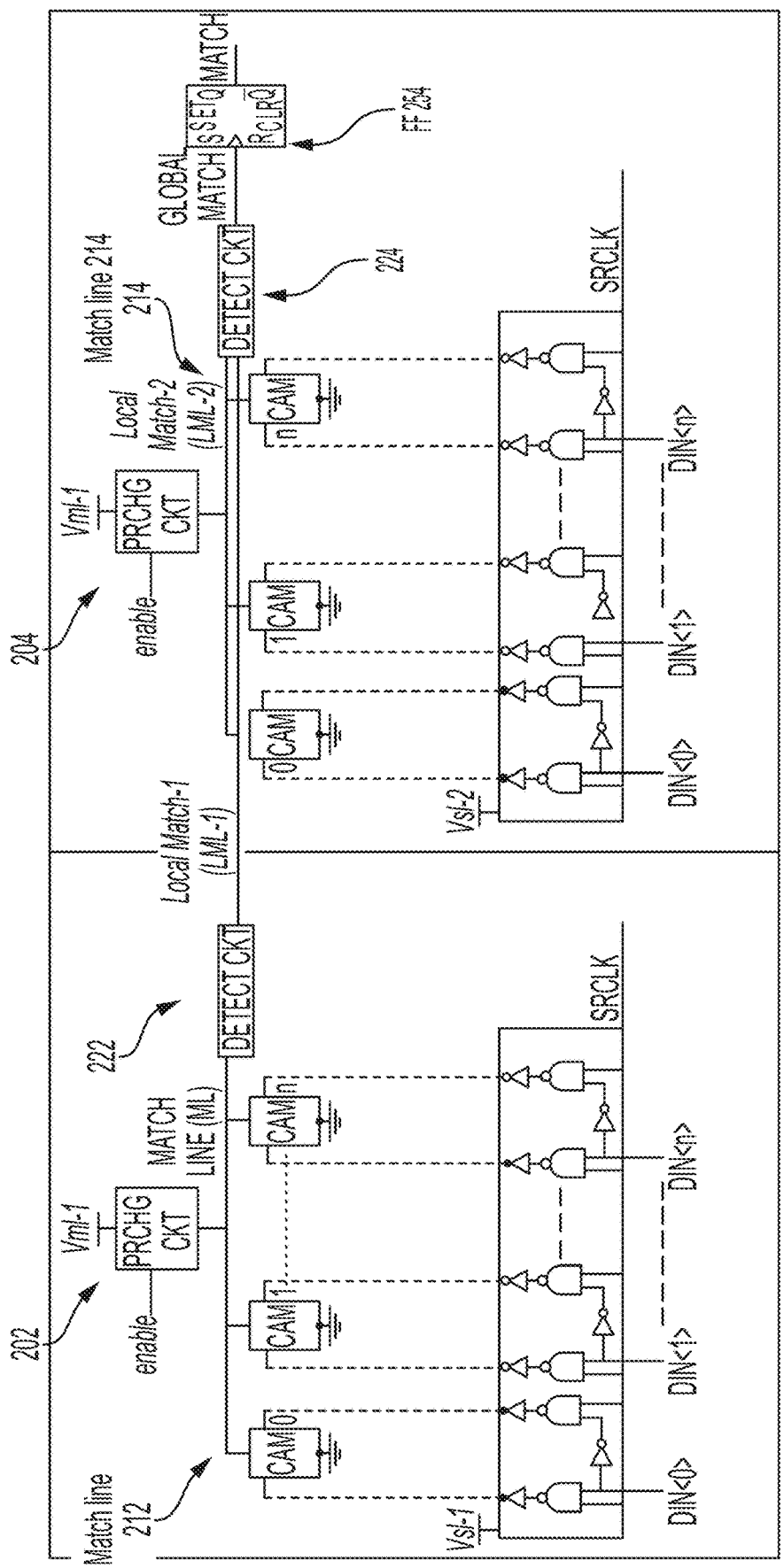
FIG. 6 is a block diagram illustrating one row according to another architecture of the memory device of FIG. 1A, in accordance with some embodiments.

In some embodiments, segment-wise comparisons are pipelined in different clock cycles, while in other embodiments, the comparisons are performed serially in the same clock cycle. An example of a serial architecture is depicted in FIG. 6, in accordance with some embodiments. This implementation is similar in some respects to the implementation of FIG. 2A. Unlike in the implementation of FIG. 2A, however, the stages are placed in series. Detector 222, which is connected to match line 212, has an output connected to the input of detector 224. Detector 224 is also connected to match line 214 and provides the global line match to flip flop 254. As a result, comparisons over the stages are performed in a serial fashion, instead of a parallel fashion, as for example in FIG. 2A.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A memory device comprising:
   a plurality of rows of memory cells, wherein a first row of the plurality of rows comprises a first segment and a second segment, the first segment comprises a first subset of the memory cells of the first row and the second segment comprises a second subset of the memory cells of the first row;
   a first match line coupled to the memory cells of the first subset and a second match line coupled to the memory cells of the second subset; and
   a first pre-charge circuit configured to pre-charge the first match line to a first non-zero pre-charge voltage and a second pre-charge circuit configured to pre-charge the second match line to a second non-zero pre-charge voltage different from the first non-zero pre-charge voltage.

2. The memory device of claim 1, further comprising a first clock circuit configured to clock the first segment at a first clock rate and a second clock circuit configured to clock the second segment at a second clock rate.

3. The memory device of claim 2, wherein the first non-zero pre-charge voltage is less than the second non-zero pre-charge voltage and the first clock rate is less than the second clock rate.

4. The memory device of claim 1, wherein:
the first row is configured to store a numeric sequence, wherein the memory cells of the first subset are configured to store a first portion of the numeric sequence and the memory cells of the second subset are configured to store a second portion of the numeric sequence, and the memory device further comprises:
a first input circuit configured to provide a first portion of an input numeric sequence to the first segment of the first row; and
a second input circuit configured to provide a second portion of the input numeric sequence to the second segment of the first row.

5. The memory device of claim 4, further comprising a first supply circuit configured to supply the first input circuit with a first supply voltage and a second supply circuit configured to supply the second input circuit with a second supply voltage different from the first supply voltage.

6. The memory device of claim 5, further comprising a first clock circuit configured to clock the first input circuit at a first clock rate and a second clock circuit configured to clock the second input circuit at a second clock rate different from the first clock rate.

7. The memory device of claim 6, wherein the first supply voltage is less than the second supply voltage and the first clock rate is less than the second clock rate.

8. The memory device of claim 1, wherein the memory device is a content addressable memory (CAM), and wherein each of the plurality of rows further comprises a plurality of comparators, each comparator being coupled to a corresponding memory cell.

9. The memory device of claim 1, wherein the first pre-charge circuit comprises a first transistor and the second pre-charge circuit comprises a second transistor, wherein the first and second transistors have different dimensions.

10. The memory device of claim 1, wherein the first pre-charge circuit comprises a first transistor and the second circuit comprises a second transistor, wherein the first and second transistors have different threshold voltages.

11. The memory device of claim 1, further comprising a first delay unit configured to provide, based on a common input clock, a first clock to the first segment and a second delay unit configured to provide, based on the common input clock, a second clock to the second segment, wherein the first and second delay units produce different delays.

12. A memory device comprising:
a plurality of rows of memory cells, wherein a first row of the plurality of rows comprises a first segment and a second segment, the first segment comprises a first subset of the memory cells of the first row and the second segment comprises a second subset of the memory cells of the first row, wherein the memory cells of the first subset are configured to store a first portion of a numeric sequence and the memory cells of the second subset are configured to store a second portion of the numeric sequence;
a first input circuit configured to provide a first portion of an input numeric sequence to the first segment of the first row;
a second input circuit configured to provide a second portion of the input numeric sequence to the second segment of the first row; and
a first supply circuit configured to supply the first input circuit with a first supply voltage and a second supply circuit configured to supply the second input circuit with a second supply voltage different from the first supply voltage.

13. The memory device of claim 12, wherein the first segment of the first row comprises a first plurality of comparators configured to compare, collectively, the first portion of the input numeric sequence to the first portion of the numeric sequence, and
wherein the second segment of the first row comprises a second plurality of comparators configured to compare, collectively, the second portion of the input numeric sequence to the second portion of the numeric sequence.

14. The memory device of claim 12, further comprising a first clock circuit configured to clock the first input circuit at a first clock rate and a second clock circuit configured to clock the second input circuit at a second clock rate different from the first clock rate.

15. The memory device of claim 14, wherein the first supply voltage is less than the second supply voltage and the first clock rate is less than the second clock rate.

16. A method for controlling a memory device comprising a plurality of rows of memory cells, wherein a first row of the plurality of rows comprises a first segment and a second segment, the first segment comprises a first subset of the memory cells of the first row and the second segment comprises a second subset of the memory cells of the first row, the method comprising:
pre-charging a first match line to a first pre-charge voltage, the first match line being coupled to the memory cells of the first subset;
pre-charging a second match line to a second pre-charge voltage different from the first pre-charge voltage, the second match line being coupled to the memory cells of the second subset;
with a first input circuit, providing a first portion of an input numeric sequence to a first segment of the first row;
with a second input circuit, providing a second portion of the input numeric sequence to a second segment of the first row; and
performing a comparison over the second segment of the first row in response to a comparison over the first segment of the first row producing a match.

17. The method of claim 16, further comprising:
supplying the first input circuit with a first supply voltage; and
supplying the second input circuit with a second supply voltage different from the first supply voltage.

* * * * *